United States Patent
Erez et al.

(10) Patent No.: US 9,858,990 B2
(45) Date of Patent: Jan. 2, 2018

(54) HARDWARE-BASED PERFORMANCE EQUALIZATION FOR STORAGE DEVICES

(71) Applicant: APPLE INC., Cupertino, CA (US)

(72) Inventors: Liran Erez, Petach Tikva (IL); Guy Ben-Yehuda, Hod Hasharon (IL); Avraham (Poza) Meir, Rishon Lezion (IL); Ori Isachar, Herzliya (IL)

(73) Assignee: APPLE INC., Cupertino, CA (US)

( * ) Notice: Subject to any disclaimer, the term of this patent is extended or adjusted under 35 U.S.C. 154(b) by 215 days.

(21) Appl. No.: 14/574,527

(22) Filed: Dec. 18, 2014

(65) Prior Publication Data

US 2016/0179373 A1    Jun. 23, 2016

(51) Int. Cl.
G11C 11/56 (2006.01)
G11C 7/10 (2006.01)

(52) U.S. Cl.
CPC ........ G11C 11/5628 (2013.01); G11C 7/1045 (2013.01); G11C 7/1063 (2013.01)

(58) Field of Classification Search
CPC ....... G06F 3/061; G06F 3/0659; G06F 3/0673
USPC ...................................................... 711/154
See application file for complete search history.

(56) References Cited

U.S. PATENT DOCUMENTS

| | | |
|---|---|---|
| 5,696,717 A | 12/1997 | Koh |
| 5,973,962 A | 10/1999 | Kwon |
| 7,272,049 B2 | 9/2007 | Kang et al. |
| 7,359,248 B2 | 4/2008 | Chen et al. |
| 7,689,805 B2 | 3/2010 | Moore et al. |
| 8,027,827 B2 | 9/2011 | Bitar et al. |
| 8,595,597 B2 | 11/2013 | Xie et al. |
| 8,634,247 B1 | 1/2014 | Sprouse et al. |
| 8,780,635 B2 | 7/2014 | Li et al. |
| 2004/0172506 A1* | 9/2004 | Gotoh ............... G06F 3/0611 711/158 |
| 2009/0300277 A1* | 12/2009 | Jeddeloh ............ G06F 12/0246 711/104 |
| 2012/0127807 A1* | 5/2012 | Pio .................... G11C 5/147 365/189.09 |

FOREIGN PATENT DOCUMENTS

| | | |
|---|---|---|
| CN | 103365787 A | 10/2013 |
| WO | 2005057585 A2 | 6/2005 |
| WO | 2009062130 A2 | 5/2009 |

OTHER PUBLICATIONS

Jacob et al., Memory Systems Cache, DRAM, Disk, Morgan Kaufmann Publishers, 2008, p. 538.*
Fisher, Ryan, Optimizing NAND Flash Performance, Flash Memory Summit, Aug. 2008.*

* cited by examiner

*Primary Examiner* — Prasith Thammavong
*Assistant Examiner* — Edmund Kwong
(74) *Attorney, Agent, or Firm* — D. Kligler IP Servies Ltd.

(57) ABSTRACT

An apparatus includes a register memory and circuitry. The register memory is configured to hold a minimal value specified for a performance measure of a given type of memory access commands, whose actual performance measures vary among memory devices. The circuitry is configured to receive a memory access command of the given type, to execute the received memory access command in one or more memory devices, and to acknowledge the memory access command not before reaching the minimal value stored in the register memory.

20 Claims, 2 Drawing Sheets

HARDWARE-BASED PERFORMANCE EQUALIZATION FOR STORAGE DEVICES

TECHNICAL FIELD

Embodiments described herein relate generally to data storage, and particularly to methods and systems for equalizing performance among storage devices.

SUMMARY

An embodiment that is described herein provides an apparatus including a register memory and circuitry. The register memory is configured to hold a minimal value specified for a performance measure of a given type of memory access commands, whose actual performance measures vary among memory devices. The circuitry is configured to receive a memory access command of the given type, to execute the received memory access command in one or more memory devices, and to acknowledge the memory access command not before reaching the minimal value stored in the register memory.

In some embodiments, the register memory is configured to hold multiple minimal values specified for respective different types of the memory access commands, and the circuitry is configured to identify a type of the received memory access command, and to acknowledge the received memory access command not before reaching the respective minimal value specified for the identified type.

In an embodiment, the memory access commands include write commands, and the performance measure includes write duration. In another embodiment, the performance measure includes a duration of executing the memory access commands of the given type, and the circuitry is configured to initialize a timer to measure the minimal value stored in the register memory, to start the timer upon receiving the memory access command for execution, and to acknowledge the memory access command not before the timer expires.

In yet another embodiment, the register memory or the circuitry is configured to reconfigure the minimal value in response to an external instruction. In an embodiment, the register memory and the circuitry are integrated in the given memory device. In an alternative embodiment, the register memory and the circuitry are integrated in a controller that stores data in the given memory device.

There is additionally provided, in accordance with an embodiment that is described herein, a system including one or more memory devices, a processor and a performance equalization unit. The performance equalization unit is configured to hold a minimal value specified for a performance measure of a given type of memory access commands, whose actual performance measures vary among memory devices, to receive from the processor a memory access command of the given type, to execute the received memory access command in the one or more memory devices, and to acknowledge the memory access command not before reaching the minimal value stored in the register memory.

There is further provided, in accordance with an embodiment that is described herein, a method including holding a minimal value specified for a performance measure of a given type of memory access commands, whose actual performance measures vary among memory devices. A memory access command of the given type is received and executed in one or more memory devices. The memory access command is acknowledged not before reaching the minimal value.

These and other embodiments will be more fully understood from the following detailed description of the embodiments thereof, taken together with the drawings in which:

DETAILED DESCRIPTION OF EMBODIMENTS

Overview

Figure 1:
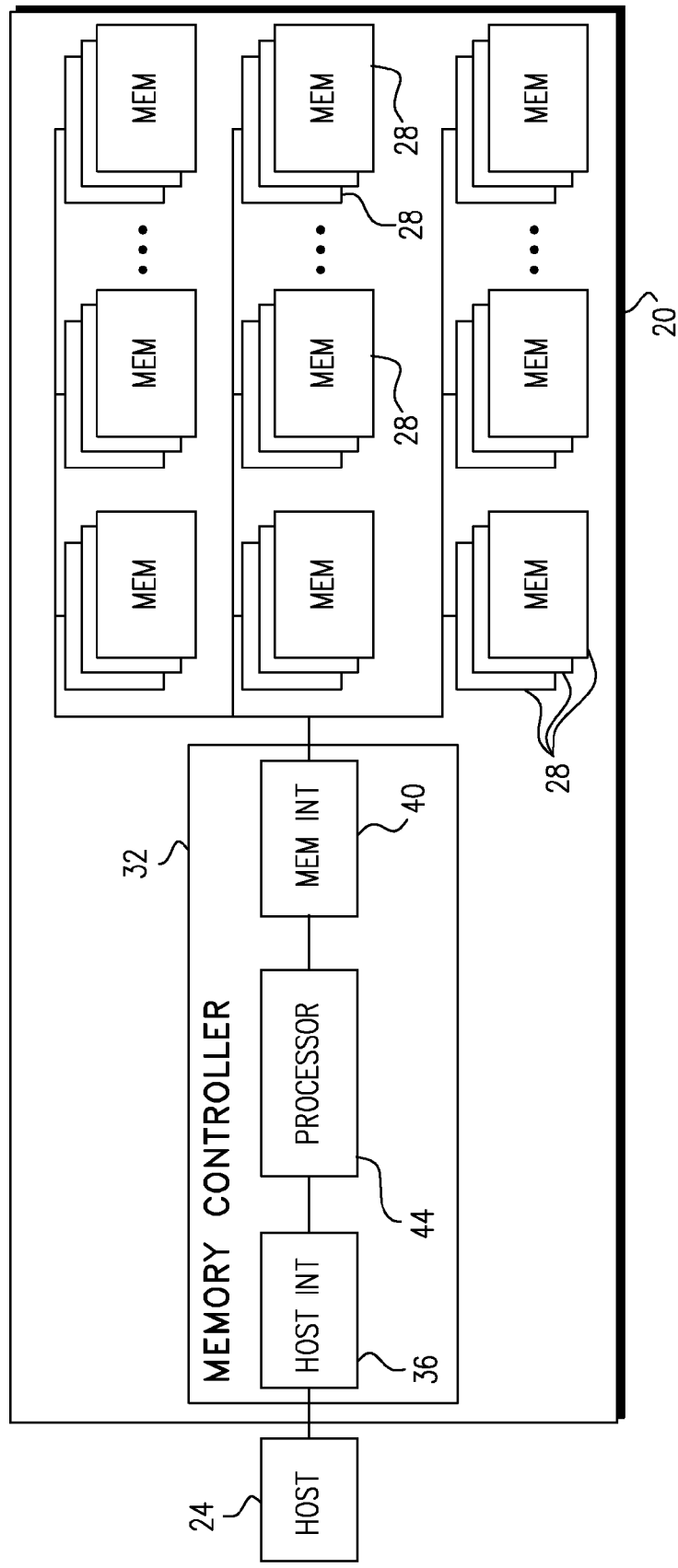
FIG. 1 is a block diagram that schematically illustrates a memory system, in accordance with an embodiment that is described herein.

In some storage systems it is desirable to keep a certain performance measure constant, or at least within a small range, even though the actual performance measure varies significantly. Consider, for example, a Solid State Drive (SSD) that comprises a memory controller and multiple Flash memory devices. The duration of a write command (also referred to as programming time—$T_{PROG}$) varies from one Flash memory device to another. In some cases, however, it is desirable that all SSDs of a given model will appear to their host systems and users as having uniform and repeatable latency and throughput.

Embodiments that are described herein provide methods and apparatus for reducing the variance in performance among different memory devices and different storage systems. In some embodiments, a storage system comprises a memory controller that stores data in one or more memory devices. The system further comprises a performance equalization unit that mediates between a processor of the memory controller and the memory devices, so as to compensate for the variability of the performance measure in question.

Typically, the performance equalization unit holds a minimal value that was specified for the performance measure. Upon receiving a memory access command from the processor, the performance equalization unit executes the command in the memory devices, but acknowledges the memory access command to the processor not before reaching the minimal value stored in the register memory. If the actual performance measure of the memory devices is below the minimal specified value, the acknowledgement is independent of the actual performance measure.

In an example embodiment relating to $T_{PROG}$ equalization, the performance equalization unit comprises a timer that is initialized to the specified minimal $T_{PROG}$ value. Upon receiving a write command from the processor, the performance equalization unit triggers the timer, and acknowledges the write command not before the timer expires. Consequently, all write commands will appear to the processor as having at least the minimal specified $T_{PROG}$ value. Although this technique increases the average $T_{PROG}$, it eliminates the variability in $T_{PROG}$.

Several implementation examples of the performance equalization unit are described herein. In some embodiments, the performance equalization unit uses multiple minimal $T_{PROG}$ values that are specified for respective different types of write commands, such as write commands of different page types. In some embodiments the minimal $T_{PROG}$ values are configurable, e.g., by the processor of the memory controller. The performance equalization unit is typically implemented in hardware, and may be integrated, for example, in the memory controller or in a memory device.

The techniques described herein enable storage systems (e.g., SSDs) to appear as having uniform performance, even though the actual performance of the memory devices in the systems in highly variable. In an example use case, storage systems can be assembled using different types of memory devices (e.g., devices of different vendors, lots, versions, generations or configurations) in a way that is transparent to external users.

System Description

FIG. 1 is a block diagram that schematically illustrates a memory system 20, in accordance with an embodiment that is described herein. System 20 accepts data for storage from a host 24 and stores it in memory, and retrieves data from memory and provides it to the host. In the present example, system 20 comprises a Solid-State Disk (SSD) that stores data for a host computer. In alternative embodiments, however, system 20 may be used in any other suitable application and with any other suitable host, such as in computing devices, mobile phones or other communication terminals, removable memory modules such as removable memory modules, Secure Digital (SD) cards, Multi-Media Cards (MMC) and embedded MMC (eMMC), digital cameras, music and other media players and/or any other system or device in which data is stored and retrieved.

System 20 comprises multiple memory devices 28, each comprising multiple analog memory cells. In the present example, devices 28 comprise non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM) and/or magnetic RAM (MRAM), or various three-dimensional memory configurations, can also be used. Although the embodiments described herein refer mainly to NVM, the disclosed techniques can also be applied in volatile memory devices.

The memory cells are typically arranged in rows and columns. Typically, a given memory device comprises multiple erasure blocks (also referred to as memory blocks), i.e., groups of memory cells that are erased together. Data typically cannot be reprogrammed in-place, and memory blocks are therefore erased before being programmed with other data.

As noted above, each memory device 28 may comprise a packaged device or an unpackaged semiconductor chip or die. A typical memory system may comprise a number of 4 GB, 8 GB or higher capacity memory devices. Generally, however, system 20 may comprise any suitable number of memory devices of any desired type and size.

System 20 comprises a memory controller 32, which accepts data from host 24 and stores it in memory devices 28, and retrieves data from the memory devices and provides it to the host. Memory controller 32 comprises a host interface 36 for communicating with host 24, a memory interface 40 for communicating with memory devices 28, and a processor 44 that processes the stored and retrieved data. The software running on processor 44 may comprise storage management software that is sometimes referred to as "Flash management" or "Flash Translation Layer" (FTL).

The functions of processor 44 can be implemented, for example, using software running on a suitable Central Processing Unit (CPU), using hardware (e.g., state machine or other logic), or using a combination of software and hardware elements.

Equalization of Programming Time Among Memory Devices

In some practical scenarios it is desirable that all SSDs 20 of a certain model or batch exhibit uniform and predictable performance to host 24, and thus to users of the host system. For the sake of clarity, the description that follows refers mainly to equalizing the duration of executing write commands (also referred to as programming commands). This duration is referred to herein as write time or programming time—$T_{PROG}$. The disclosed techniques, however, may be used for equalizing other suitable performance measures such as erasure time or readout time, among others.

In some embodiments, SSD 20 compensates internally for the variability of $T_{PROG}$ from one memory device 28 to another. As a result, all SSDs 20 of a given type or batch appear to their hosts and users as having similar $T_{PROG}$.

Figure 2:
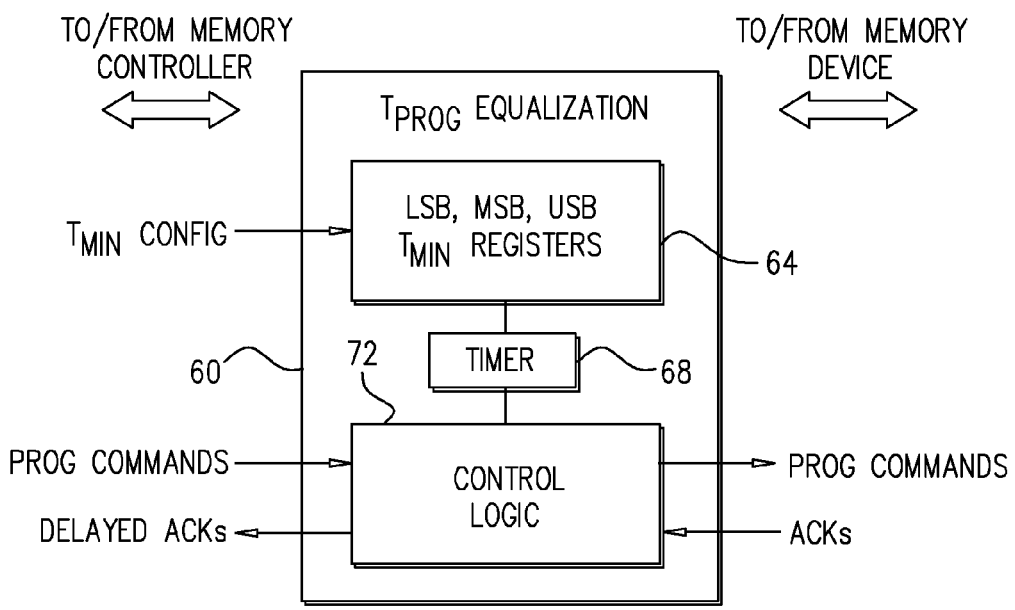
FIG. 2 is a block diagram that schematically illustrates a programming time equalization unit, in accordance with an embodiment that is described herein.

FIG. 2 is a block diagram that schematically illustrates a $T_{PROG}$ equalization unit 60, in accordance with an embodiment that is described herein. Unit 60 is also referred to generally as a performance equalization unit. In some embodiments unit 60 is integrated in memory controller 32. In alternative embodiments unit 60 is integrated in one or more of memory devices 28. In either case, unit 60 mediates between processor 44 and memory devices 28, in order to compensate for $T_{PROG}$ variability.

In the embodiment of FIG. 2, unit 60 comprises a register memory 64, a timer 68 and control logic 72. The control logic and timer are also referred to collectively as circuitry. Register memory 64 holds one or more minimal $T_{PROG}$ values (denoted $T_{MIN}$) that are specified for different respective types of write commands. Register memory 64 is also referred to below as simply "registers 64" for brevity.

In the present example, memory devices 28 comprise Triple-Level Cell (TLC) devices that store three types of memory pages denoted Least Significant Bit (LSB), Most significant Bit (MSB) and Upper Significant Bit (USB) pages. Memory devices support three respective types of write commands, denoted LSB write, MSB write and USB write. Each type of write command has a respective sequence of programming and I/O operations. Thus, register memory 64 holds three $T_{MIN}$ values, one for each type of write command.

In alternative embodiments, memory devices 28 may support any other suitable set of (one or more) types of write commands. Additional examples of types of write commands may comprise single-plane write commands, multi-plane write commands, and/or cache-mode write commands. Registers 64 hold a respective $T_{MIN}$ value for each type of command. As noted above, the disclosed techniques can also be used with other types of commands such as read and erase commands.

Upon receiving a write command of a given type from processor 44, control logic 72 forwards the command for execution in memory devices 28. In addition, control logic 72 triggers timer 68 to count the minimal $T_{PROG}$ specified for that type of write command. Typically, logic 72 initializes timer 68 with the $T_{MIN}$ value stored in the appropriate register 64, and then starts the timer.

After a certain time period (either before or after timer 68 expires), control logic 72 receives an acknowledgement (ACK) from memory devices 28, indicating that the write command is completed. If the ACK arrives before expiry of timer 68, control logic 72 holds the ACK and forwards it to processor 44 only after the timer expires. Therefore, the write command appears to processor 44 as having at least the minimal specified write duration, i.e., $T_{PROG} \geq T_{MIN}$, even though the actual $T_{PROG}$ in the memory devices was shorter. In cases where the ACK from the memory devices is received after timer 68 has expired (i.e., if the actual $T_{PROG}$ is larger than $T_{MIN}$), control logic 72 transfers the ACK to processor 44 immediately.

In a typical embodiment, the ACKs are implemented using a Ready/Busy (R/B) signal that indicates whether the memory device is still busy executing the command or ready to receive a new command. In this embodiment, control logic 72 receives the R/B signal from the memory device, and enables a corresponding R/B signal toward processor 44 to become 'ready' only after timer 68 expires. Generally, the ACKs may be implemented using any suitable signal, message or register readout, e.g., by the memory device setting one or more bits in a status register that is read by control logic 72.

Processor 44 will typically issue a new write command only after the R/B signal indicates 'ready'. Therefore, when the actual $T_{PROG}$ values of the memory devices are below the specified $T_{MIN}$, the write latency and throughput of the SSD will not depend on the actual $T_{PROG}$, but rather on the specified $T_{MIN}$. As such, all SSDs will appear as having uniform write latency and throughput. In alternative embodiments, any other suitable ACK mechanism can be used between the memory devices and unit 60, and between unit 60 and processor 44.

In an example scenario, a certain type of write command has a $T_{PROG}$ of 2 mS with a standard deviation of 100 µS. In this example, $T_{MIN}$ in registers 64 may be set to 2.1 mS. In alternative embodiments, any other suitable values can be used.

Note that, in addition to equalizing $T_{PROG}$, the disclosed technique also reduces power consumption because memory controller 32 does not need to check for completion of the write command until after $T_{MIN}$.

Typically, the $T_{MIN}$ values stored in registers 64 are externally configurable, e.g., by processor 44. In the example of FIG. 2, processor 44 reconfigures the $T_{MIN}$ values in registers 64 using an interface denoted $T_{MIN}$CON-FIG. Registers 64 or logic 72 reconfigure the $T_{MIN}$ values accordingly.

Figure 3:
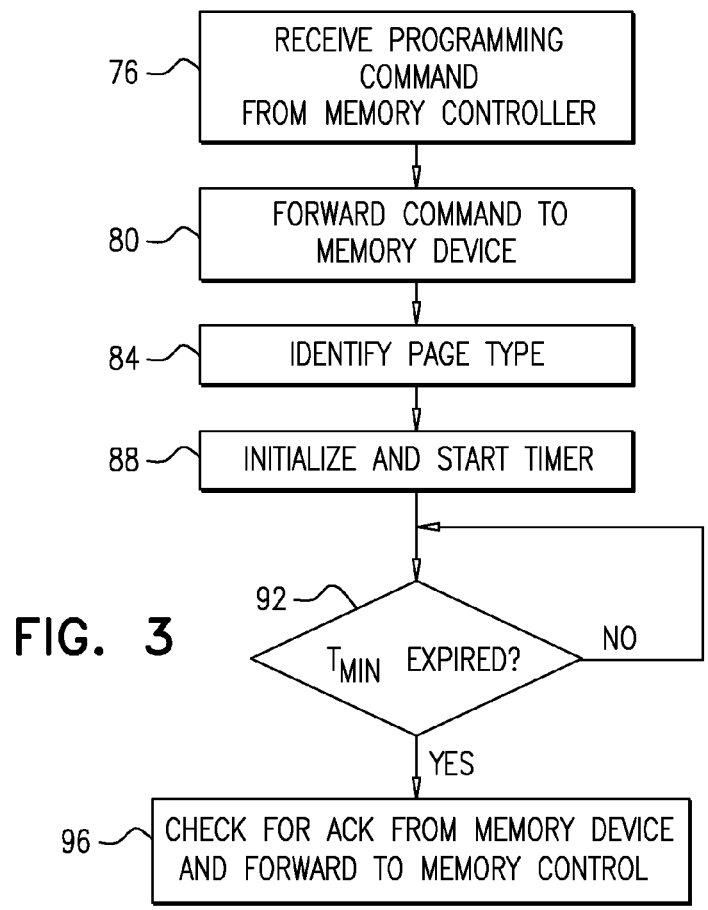
FIG. 3 is a flow chart that schematically illustrates a method for programming time equalization, in accordance with an embodiment that is described herein.

FIG. 3 is a flow chart that schematically illustrates a method for programming time equalization, in accordance with an embodiment that is described herein. The method begins with logic 72 in unit 60 receiving a write command from processor 44, at a command reception step 76.

Logic 72 forwards the write command to memory device 28, at a command forwarding step 80. In addition, logic 72 identifies the type of write command, in the present example the page type being programmed, at a type identification step 84. At a timer activation step 88, logic 72 initializes timer 68 with the $T_{MIN}$ value in registers 64 that is specified for the identified type of command, and starts the timer.

At a checking step 92, logic 72 checks whether timer 68 has expired, i.e., whether $T_{MIN}$ has elapsed. After the timer expires, logic 72 starts checking for the ACK from memory device 28, and forwards the ACK to processor 44.

The configurations of system 20 and unit 60 of FIGS. 1 and 2 are example configurations, which are shown purely for the sake of conceptual clarity. Any other suitable memory system and performance equalization unit configurations can be used in alternative embodiments. As noted above, the performance equalization unit described herein may be integrated either in memory controller 32 or in memory devices 28. Elements that are not necessary for understanding the principles of the present invention, such as various interfaces, addressing circuits, timing and sequencing circuits and debugging circuits, have been omitted from the figure for clarity.

Memory controller 32, including processor 44 and unit 60 if integrated in the memory controller, may be implemented in hardware. Alternatively, the memory controller, including processor 44 and unit 60 if integrated in the memory controller, may be implemented using a microprocessor that runs suitable software, or a combination of hardware and software elements. In some embodiments, processor 44 may be capable of executing instructions programmed in software to carry out the functions described herein. The software may be downloaded to the processor in electronic form, over a network, for example, or it may, alternatively or additionally, be provided and/or stored on tangible media, such as magnetic, optical, or electronic memory. Processor 44 may also be one or more processors or cores.

In the exemplary system configuration shown in FIG. 1, memory devices 28 and memory controller 32 are implemented as separate Integrated Circuits (ICs). In alternative embodiments, however, the memory devices and the memory controller may be integrated on separate semiconductor dice in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 32 can be implemented in software and carried out by a processor or other element of the host system, or by any other type of memory controller. In some embodiments, host 24 and Memory controller 32 may be fabricated on the same die, or on separate dice in the same device package.

It will thus be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
 a register memory configured to hold multiple minimal values specified for a performance measure of respective different types of memory access commands, wherein actual performance measures of the memory access commands vary among memory devices; and
 circuitry configured to: receive a memory access command; identify a type of the received memory access command; execute the received memory access command in one or more memory devices; and acknowledge the memory access command, wherein the acknowledgement is sent after a time period corresponding to the respective minimal value stored in the register memory for the identified type of access command, has passed from receiving the memory access command.

2. The apparatus according to claim 1, wherein the memory access commands comprise write commands, and wherein the performance measure comprises write duration.

3. The apparatus according to claim 1, wherein the performance measure comprises a duration of executing the memory access commands, and wherein the circuitry is configured to: initialize a timer to measure the respective minimal value stored in the register memory; start the timer upon receiving the memory access command for execution, and acknowledge the memory access command not before the timer expires.

4. The apparatus according to claim 1, wherein the register memory or the circuitry is configured to reconfigure the minimal value in response to an external instruction.

5. The apparatus according to claim 1, wherein the register memory and the circuitry are integrated in the given memory device.

6. The apparatus according to claim 1, wherein the register memory and the circuitry are integrated in a controller that stores data in the given memory device.

7. The apparatus according to claim 1, wherein the register memory is configured to hold multiple minimal values specified for respective different types of memory access write commands, and wherein the circuitry is configured to: identify a type of a received memory access write command; and acknowledge the received memory access write command after a time period corresponding to the respective minimal value specified for the identified type has passed from receiving the memory access write command.

8. The apparatus according to claim 7, wherein the register memory is configured to hold multiple minimal values specified for respective different types of memory access write commands including accesses to Least Significant Bit (LSB), Most significant Bit (MSB) and Upper Significant Bit (USB) pages.

9. The apparatus according to claim 7, wherein the register memory is configured to hold multiple minimal values specified for respective different types of memory access write commands including single-plane write commands, multi-plane write commands, and cache-mode write commands.

10. A system, comprising:
one or more memory devices;
a processor; and
a performance equalization unit configured to:
hold multiple minimal values specified for a performance measure of respective different types of memory access commands, wherein actual performance measures of the memory access commands vary among memory devices;
receive from the processor a memory access command;
identify a type of the received memory access command;
execute the received memory access command in the one or more memory devices; and
acknowledge the memory access command, wherein the acknowledgement is sent after a time period corresponding to the respective minimal value stored in the register memory for the identified type of access command, has passed from receiving the memory access command.

11. The system according to claim 10, wherein the memory access commands comprise write commands, and wherein the performance measure comprises write duration.

12. The system according to claim 10, wherein the performance measure comprises a duration of executing the memory access commands, and wherein the performance equalization unit is configured to: initialize a timer to measure the respective minimal value stored in the register memory; start the timer upon receiving the memory access command for execution; and acknowledge the memory access command not before the timer expires.

13. The system according to claim 10, wherein the performance equalization unit is configured to reconfigure the minimal value in response to an external instruction.

14. The system according to claim 10, wherein the performance equalization unit is integrated in the one or more memory devices.

15. The system according to claim 10, wherein the performance equalization unit is integrated in a memory controller that comprises the processor.

16. The system according to claim 10, wherein the performance equalization unit is configured to: hold multiple minimal values specified for respective different types of the memory access write commands; identify a type of the received memory write access command; and acknowledge the received memory access write command after a time period corresponding to the respective minimal value specified for the identified type has passed from receiving the memory access write command.

17. A method, comprising:
holding in a register memory multiple minimal values specified for a performance measure of respective different types of memory access commands, whose actual performance measures vary among memory devices;
receiving a memory access command;
identifying a type of the received memory access command;
executing the received memory access command in one or more memory devices; and
acknowledging the memory access command, wherein the acknowledgement is sent after a time period corresponding to the respective minimal value for the identified type of access command, has passed from receiving the memory access command.

18. The method according to claim 17, wherein the performance measure comprises a duration of executing the memory access commands, and wherein acknowledging the memory access command comprises initializing a timer to measure the respective minimal value stored in the register memory, starting the timer upon receiving the memory access command for execution, and acknowledging the memory access command not before the timer expires.

19. The method according to claim 17, and comprising reconfiguring the minimal value in response to an external instruction.

20. The method according to claim 17, wherein the different types of memory access commands comprise different types of write commands, and wherein the performance measure comprises write duration.

* * * * *